(12) United States Patent
Hosokawa

(10) Patent No.: US 10,928,263 B2
(45) Date of Patent: Feb. 23, 2021

(54) SENSOR DEVICE HAVING ADHESIVE BETWEEN SENSOR PORTION AND CASING PORTION

(71) Applicant: FUJI ELECTRIC CO., LTD., Kanagawa (JP)

(72) Inventor: Eiji Hosokawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 128 days.

(21) Appl. No.: 16/258,494

(22) Filed: Jan. 25, 2019

(65) Prior Publication Data

US 2019/0285498 A1 Sep. 19, 2019

(30) Foreign Application Priority Data

Mar. 13, 2018 (JP) .............................. JP2018-046062

(51) Int. Cl.
*G01L 19/14* (2006.01)
*G01L 9/04* (2006.01)
*H01L 23/00* (2006.01)
*H01L 29/84* (2006.01)

(52) U.S. Cl.
CPC ................ *G01L 19/14* (2013.01); *G01L 9/04* (2013.01); *H01L 24/30* (2013.01); *H01L 24/49* (2013.01); *H01L 24/73* (2013.01); *H01L 29/84* (2013.01); *H01L 2224/48091* (2013.01); *H01L 2224/49175* (2013.01); *H01L 2224/73265* (2013.01)

(58) Field of Classification Search
USPC .................................................. 73/700–756
See application file for complete search history.

(56) References Cited

U.S. PATENT DOCUMENTS

| | | | | |
|---|---|---|---|---|
| 2011/0167912 A1* | 7/2011 | Ohta | ..................... | G01P 15/125 73/504.12 |
| 2015/0277617 A1* | 10/2015 | Gwin | ...................... | G06F 3/044 345/174 |
| 2017/0059434 A1* | 3/2017 | Li | ......................... | G01L 9/0072 |
| 2017/0092997 A1* | 3/2017 | Fukuda | ............... | H01M 10/425 |
| 2019/0041372 A1* | 2/2019 | Wiget | .................... | H01L 23/60 |
| 2019/0285499 A1* | 9/2019 | Ikesho | ....................... | G01L 9/04 |

FOREIGN PATENT DOCUMENTS

| | | |
|---|---|---|
| JP | H06186104 A | 7/1994 |
| JP | 2001201415 A | 7/2001 |
| JP | 2002098709 A | 4/2002 |
| JP | 2003083828 A | 3/2003 |
| JP | 6044368 B2 | 12/2016 |

* cited by examiner

*Primary Examiner* — Andre J Allen

(57) ABSTRACT

A sensor device including: a sensor portion; a casing portion housing the sensor portion; an elastic portion that is provided in contact with the casing portion between the sensor portion and the casing portion and has a material having smaller elastic modulus than elastic modulus of the casing portion; and an adhesive that is provided between the sensor portion and the casing portion is provided. The adhesive may have an interface between the elastic portion and the adhesive. The elastic portion may have the same material as the adhesive. The elastic portion may have smaller elastic modulus than the adhesive.

10 Claims, 7 Drawing Sheets

SENSOR DEVICE HAVING ADHESIVE BETWEEN SENSOR PORTION AND CASING PORTION

The contents of the following Japanese patent application(s) are incorporated herein by reference:
NO. 2018-046062 filed in JP on Mar. 13, 2018.

BACKGROUND

1. Technical Field

The present invention relates to a sensor device.

2. Related Art

Conventionally, sensor devices including sensor portions connected to casing portions via adhesive are known (refer to Patent Documents 1 to 4, for example).

Patent Document 1: Japanese Patent Application Publication No. 06-186104
Patent Document 2: Japanese Patent Application Publication No. 2001-201415
Patent Document 3: Japanese Patent Application Publication No. 2002-098709
Patent Document 4: Japanese Patent Application Publication No. 2003-083828

For sensor devices, preferably, an influence of the stress from the casing portion to the sensor portion is smaller.

SUMMARY

The first aspect of the present invention provides a sensor device including: a sensor portion; a casing portion housing the sensor portion; an elastic portion that is provided in contact with the casing portion between the sensor portion and the casing portion and has a material having smaller elastic modulus than elastic modulus of the casing portion; and an adhesive that is provided between the sensor portion and the casing portion.

The adhesive may have an interface between the elastic portion and the adhesive.

The elastic portion may have the same material as the adhesive.

The elastic portion may have smaller elastic modulus than the adhesive.

The elastic portion may have higher viscosity than the adhesive.

The elastic portion may be provided in contact with the sensor portion.

The elastic portion may be fixed on the casing portion.

The casing portion may have a protrusion portion on a mounting surface on which the sensor portion is mounted, and the elastic portion may be provided between the protrusion portion and the sensor portion.

The protrusion portion may have a concave part on the upper surface. The elastic portion may be provided between the sensor portion and the concave part.

The adhesive may be provided under the sensor portion and apart from the elastic portion.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
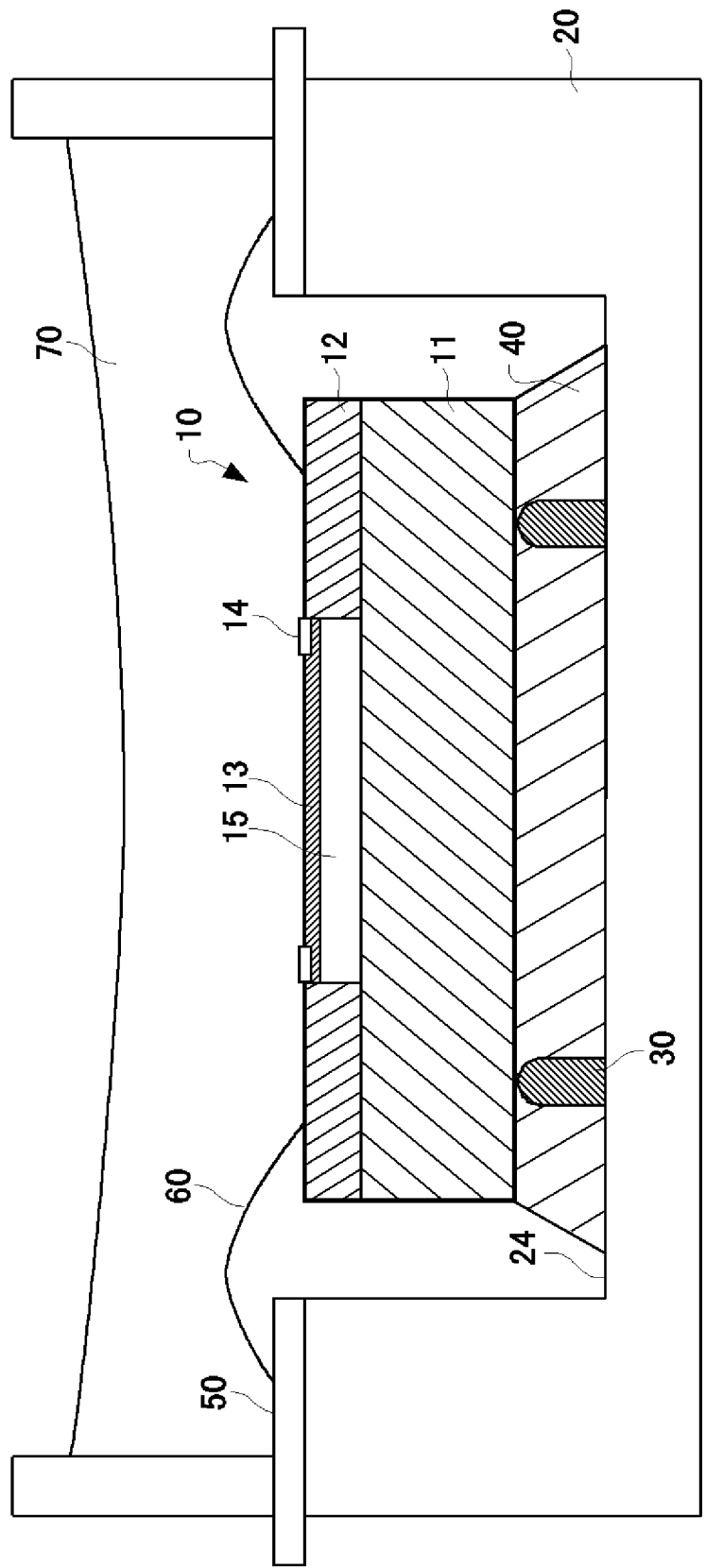
FIG. 1A shows an exemplary cross sectional view of a sensor device 100 according to Embodiment 1.

FIG. 1A shows an exemplary cross sectional view of a sensor device 100 according to Embodiment 1. The sensor device 100 in the present example includes: a sensor portion 10, a casing portion 20, elastic portions 30, an adhesive 40, a lead terminal 50, a connection portion 60, and a sealing portion 70.

In the present example, directions orthogonal to each other on a surface parallel to the principal surface of the sensor portion 10 are referred to as X-axis direction and Y-axis direction, and a direction orthogonal to the principal surface of the sensor portion 10 is referred to as Z-axis direction. XYZ axes constitute a right hand system. In the present example, the principal surfaces of the sensor portion 10 include an upper surface on an opposite side of a lower surface facing to the casing portion 20. Note that directions such as upward or downward in the present specification represent relative directions, and they do not necessarily correspond to upward or downward in the direction of gravity, or upward or downward in the direction in which the sensor device 100 is actually mounted. In the present specification, a top view means a view seen from the upper surface side of the sensor portion 10.

The sensor portion 10 is a physical quantity sensor to detect predetermined physical quantities. For example, the sensor portion 10 has a physical quantity sensor such as a pressure sensor and an acceleration sensor. In the present example, the sensor portion 10 is described as, but not limited to, a pressure sensor. The sensor portion 10 includes a pedestal portion 11, a sensor chip 12, and a diaphragm 13. The bottom surface of the sensor portion 10 is adhered on the casing portion 20. The bottom surface of the sensor portion 10 may be die-bonded on the casing portion 20 using an adhesive. The side surfaces of the sensor portion 10 are apart from the casing portion 20.

The pedestal portion 11 is jointed with the sensor chip 12 on a positive-side surface in Z-axis direction (i.e. the upper surface). The pedestal portion 11 is adhered on a mounting surface 24 of the casing portion 20 via the adhesive 40 on a negative-side surface in Z-axis direction (i.e. the lower surface). For example, the pedestal portion 11 has heat-resistant glass. Preferably, the pedestal portion 11 is carried horizontally on the mounting surface 24.

The sensor chip 12 is a chip for detecting pressure. The sensor chip 12 in the present example is a silicon (Si) chip to detect pressure applied to the sensor portion 10. For example, the sensor chip 12 is electrostatically jointed with the pedestal portion 11.

The diaphragm 13 is deflected due to the applied pressure to the sensor portion 10. The diaphragm 13 has gauge resistor portions 14. The diaphragm 13 is a thin-plate portion of the sensor chip 12 that is obtained by removing some of the back surface. For example, the diaphragm 13 has a circular planar shape. The thickness of the diaphragm 13 is different depending on the range of pressure to measure, but, for example, it is approximately several μm to several tens μm.

The gauge resistor portion 14 outputs an electrical signal depending on the deflection of the diaphragm 13. The gauge resistor portion 14 is formed of material having piezo resistance effect. Four gauge resistor portions 14 are bridge-connected to each other on the upper surface of the diaphragm 13. For example, the gauge resistances of the gauge resistor portions 14 change due to the deformation of the diaphragm 13 depending on pressure change, and the change amount of the gauge resistance is output by a bridge circuit as a voltage signal.

The space 15 is a region where some of the back surface of the sensor chip 12 is removed to form the diaphragm 13. The space 15 is a space having approximately cylinder shape that is provided in the middle of the sensor chip 12. The space 15 may be formed by the sensor chip 12 being electrostatically jointed to the pedestal portion 11.

The casing portion 20 is a casing container body to house the sensor portion 10 therein. The casing portion 20 has a concave-shaped space to house the sensor portion 10 therein. The casing portion 20 is molded of resin, using a predetermined molding form. The shape of the casing portion 20 is not limited to the present example.

Here, in addition to the pressure applied from the surrounding environment, stress may be also applied from the casing portion 20 and the adhesive 40 to the diaphragm 13 via the pedestal portion 11. For example, stress is generated due to difference in the thermal expansion between the pedestal portion 11 and the casing portion 20. Preferably, the diaphragm 13 has no influence of stress other than the surrounding environment. Thereby, detection accuracy of pressure of the sensor device 100 improves.

The elastic portions 30 absorb the stress generated between the sensor portion 10 and the casing portion 20. The elastic portions 30 are provided in contact with the casing portion 20 between the sensor portion 10 and the casing portion 20. The elastic portions 30 in the present example are in contact with the sensor portion 10, but it may be provided not in contact with the sensor portion 10. Preferably, the elastic portion 30 is formed of soft and stretchable material. For example, the elastic portion 30 is formed of material having smaller elastic modulus than the casing portion 20. The elastic modulus of the elastic portion 30 is smaller than the pedestal portion 11. By making the elastic modulus of the elastic portion 30 smaller, it becomes easier to absorb the stress between the sensor portion 10 and the casing portion 20. The elastic portions 30 are fixed on the casing portion 20. That is, the elastic portions 30 are arranged at a predetermined position on the mounting surface 24. The elastic portions 30 can be fixed on a desired position, which makes it easier to hold the sensor portion 10 horizontally.

The elastic portion 30 in the present example has a cross section having a protrusion shape with its tip pointed. By making the tip of the elastic portion 30 pointed, it becomes harder for heat stress from the casing portion 20 to be transferred to the sensor portion 10. However, preferably, the tip of the elastic portion 30 is curved smoothly.

The elastic portion 30 has a predetermined height to secure a constant space between the sensor portion 10 and the casing portion 20. By making the height of the elastic portions 30 greater, the adhesive 40 becomes thicker. By making the adhesive 40 thicker, it becomes harder for the heat stress from the casing portion 20 to be transferred to the sensor portion 10. In an example, the height of the elastic portion 30 may be greater than or equal to 10 μm, greater than or equal to 100 μm, greater than or equal to 150 μm, or greater than or equal to 200 μm. It is only required for the height of the elastic portion 30 to be smaller than the thickness of the adhesive 40.

The adhesive 40 bonds the sensor portion 10 and the casing portion 20. The adhesive 40 is provided by being filled between the sensor portion 10 and the casing portion 20. The adhesive 40 have an interface between the elastic portions 30 and the adhesive 40. For example, the interface between the elastic portions 30 and the adhesive 40 is generated by the elastic portion 30 and the adhesive 40 being cured individually. The interface may be an interface constituted by materials being discontinuously formed between the elastic portions 30 and the adhesive 40.

The adhesive 40 includes a polymeric material. The adhesive 40 may be a silicon-based polymeric material, or a fluorine-based polymeric material. The silicon-based polymeric material is low in cost. The fluorine-based polymeric material is excellent in environment resistance. Preferably, the adhesive 40 has relatively less free-oil to achieve higher viscosity. The adhesive 40 may be formed polymeric material having no free-oil. A free-oil is an additive to adjust physical properties such as elastic modulus, penetration, and hardness. By containing smaller amount of free-oil, the adhesive 40 can reduce the wetting and spreading area during die bonding of the sensor portion 10. Thus, it becomes easier to arrange the adhesive 40 within a predetermined range of area.

The elastic portions 30 may be formed of the same material as the adhesive 40. Even when the elastic portions 30 and the adhesive 40 are formed of the same material, an interface is generated between the elastic portions 30 and the adhesive 40 by being cured individually. When the elastic portions 30 and the adhesive 40 are formed of the same material, the elastic portions 30 are portions obtained by applying the adhesive 40 at several parts and making them cured.

The elastic portions 30 may be formed of different material from the adhesive 40. In an example, the elastic portion 30 has smaller elastic modulus than the adhesive 40. The elastic portion 30 has a material having smaller density of the crosslinking point to make the elastic modulus of the elastic portion 30 smaller than the adhesive 40. Since fine polymers are bonded during the elastic portion 30 being cured, the smaller density of the crosslinking points of the elastic portion 30 can result in a smaller elastic modulus. Also, the elastic portion 30 may be formed of less oil component to make the viscosity higher. The elastic portion 30 may contain no oil component at all. By adjusting the crosslinking agent and the reaction rate, or the like, the elastic portion 30 can adjust the density and the viscosity of the crosslinking point.

Also, the elastic portion 30 may have higher viscosity than the adhesive 40. As the higher the viscosity of the elastic portions 30 increases, the elastic portions 30 is less likely to get collapsed during thermal curing. Thus, the elastic portions 30 having a protrusion shape are easily formed. On the other hand, when the elastic portions 30 are flown out to the surrounding and collapsed during thermal curing, the space between the sensor portion 10 and the casing portion 20 may not be able to be sufficiently secured, resulting in the adhesive 40 being thin. As such, by making the viscosity of the elastic portion 30 higher, it becomes easier for the adhesive 40 to be formed thicker to absorb the stress from the casing portion 20.

The elastic portion 30 may be formed of adhering material and bonded on the casing portion 20. In this case, the elastic portion 30 itself is bonded on the casing portion 20. The elastic portions 30 may be the same material as the adhesive 40.

The lead terminals 50 may be insert molded integrally with the casing portion 20. One end portions of the lead terminals 50 are positioned inside of the casing portion 20 and exposed. The other end portion of the lead terminal 50 is exposed outside of the casing portion 20. The arrangement of the lead terminal 50 is not limited to this. The lead terminal 50 includes a conductive material such as copper.

The connection portion 60 electrically connects the sensor portion 10 and the lead terminal 50. The connection portion 60 may be connected to the sensor portion 10 and the lead terminal 50 via a pad. For example, the connection portion 60 is a bonding wire including at least one of gold, silver, copper, aluminum, and alloys thereof.

The sealing portion 70 is a pressure medium to transfer pressure to the sensor portion 10. The sealing portion 70 pushes the diaphragm 13 toward the pedestal portion 11 upon the atmospheric pressure and the stress being larger than the usual (e.g. the displacement of the diaphragm 13 is zero). Upon the diaphragm 13 being deflected, the gauge resistor portions 14 are compressed and the resistance values of the gauge resistor portions 14 become greater. On the other hand, upon the atmospheric pressure and the stress applied on the sealing portion 70 being smaller than the usual, the gauge resistor portions 14, together with the diaphragm 13, are pulled out in a direction leaving from the pedestal portion 11, and the resistance values of the gauge resistor portions 14 become smaller. Thereby, the sensor device 100 detects the applied pressure.

The sensor device 100 in the present example includes the elastic portions 30 between the sensor portion 10 and the casing portion 20. Thus, the sensor device 100 can prevent or reduce variation in the output due to the change in the heat stress of the casing portion 20. The sensor device 100 can also reduce the influence of the heat stress of the casing portion 20 due to over-time change.

Also, the sensor portion 10 in the present example is not in direct contact with the casing portion 20. Thus, the stress from the casing portion 20 becomes smaller. Thereby, it can be made harder to transfer the stress generated upon the casing portion 20 being changed due to the heat stress.

Figure 1B:
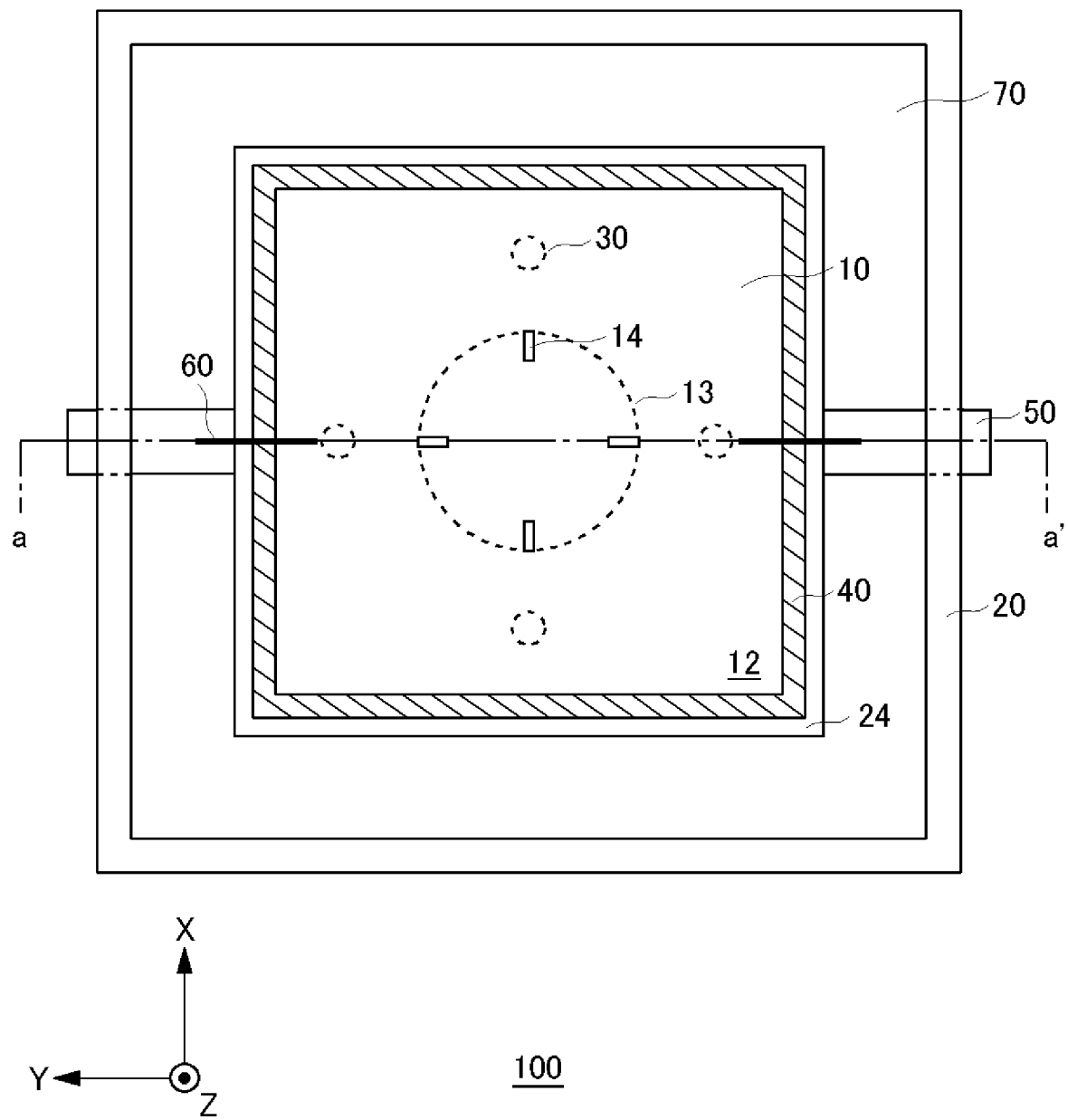
FIG. 1B shows an exemplary top view of the sensor device 100 according to Embodiment 1.

FIG. 1B shows an exemplary top view of the sensor device 100 according to Embodiment 1. The sensor device 100 in the present example includes four of the elastic portions 30. However, the arrangement and the number of the elastic portions 30 are not limited to those in the present example. The a-a' cross section is a YZ cross section passing through the center of the sensor device 100. FIG. 1A is an exemplary a-a' cross section.

Preferably, the elastic portions 30 are provided outside of the diaphragm 13 in the top view. The elastic portions 30 are evenly arranged with the diaphragm 13 being at the center. Thereby, it becomes easier to adjust output voltage of the sensor device 100. Also, it becomes harder to give a negative influence on output characteristics of the sensor device 100.

More specifically, the elastic portions 30 may be arranged outside of the diaphragm 13 in the top view, for example, at approximately regular intervals along the outer circumference of the diaphragm 13.

The elastic portions 30 are provided equally under the sensor portion 10. For example, a plurality of the elastic portions 30 are provided so as to be point-symmetrical to each other about the center of the diaphragm 13 in the top view. Thereby, it becomes easier for the sensor portion 10 to be carried horizontally. Also, an influence of the stress from the casing portion 20 to the sensor portion 10 becomes uniform regardless of the direction thereof, and thus the variation in the output of the sensor device 100 can become smaller.

The sensor portion 10 has a squared planar shape. However, the planar shape of the sensor portion 10 may have a rectangular or another shape. When the planar shape of the sensor portion 10 has a circular or ellipsoidal shape, there is no corner portion into which resin is hard to flow during the casing portion 20 being formed, and thus defective molding of the casing portion 20 can be reduced.

The mounting surface 24 has a planar shape corresponding to the planar shape of the sensor portion 10. The mounting surface 24 in the present example, like the sensor portion 10, has a squared planar shape. The mounting surface 24 may have a planar shape different from the planar shape of the sensor portion 10. Preferably, the planar shape of the mounting surface 24 is set such as the influence of the stress to the sensor portion 10 is small, and an influence on the stress to the sensor portion 10 is equal regardless of the directions.

Figure 2:
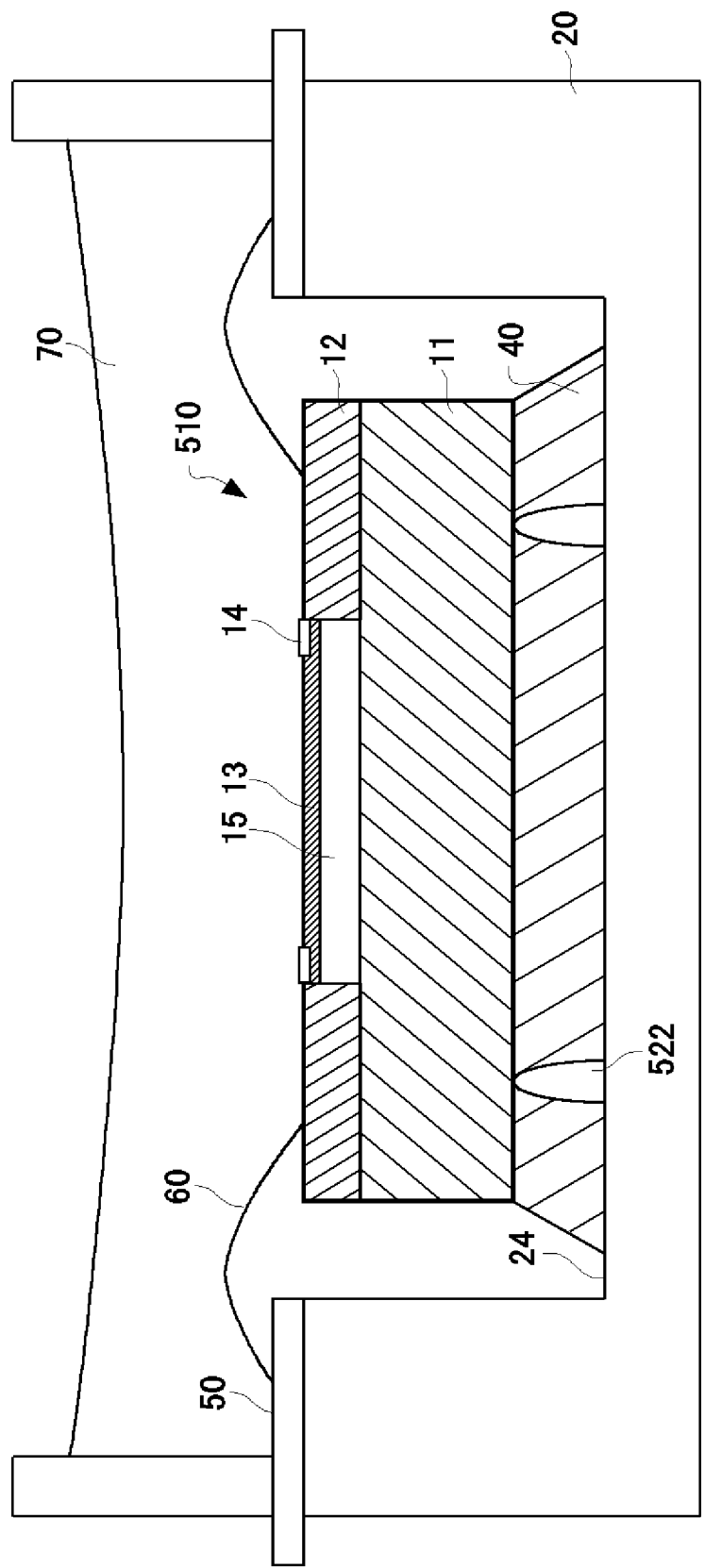
FIG. 2 shows an exemplary configuration of a sensor device 500 according to Comparative Example.

FIG. 2 shows an exemplary cross sectional view of a sensor device 500 according to Comparative Example. The sensor device 500 in the present example is different from the sensor device 100 according to Embodiment 1 in that the sensor device 500 has protrusion portions 522, instead of the elastic portions 30.

The protrusion portions 522 are provided on the mounting surface 24 of the casing portion 20. The protrusion portions 522 may be provided integrally with the casing portion 20. The protrusion portions 522 prevent or reduce the height of the adhesive 40 becoming smaller due to the adhesive 40 flowing out of the sensor portion 510.

The sensor device 500 can secure, by having the protrusion portions 522, a predetermined interval between the sensor portion 510 and the casing portion 20. However, when the protrusion portions 522 are formed of the same material as the casing portion 20, the protrusion portions 522 are hard and unstretchable, which makes it easier for the influence of the stress to be transferred to the sensor portion 510. When the influence of the stress is easily transferred to the sensor portion 510, the variation in the output of the sensor device 500 cannot be prevented or reduced, which worsens the detection accuracy.

On the other hand, in the sensor device 100 according to Embodiment 1, the stress from the casing portion 20 to the sensor portion 10 is hard to be transferred, due to the elastic portion 30 being formed of an elastic body. Thus, the variation in the output of the sensor device 100 can be prevented or reduced.

Figure 3:
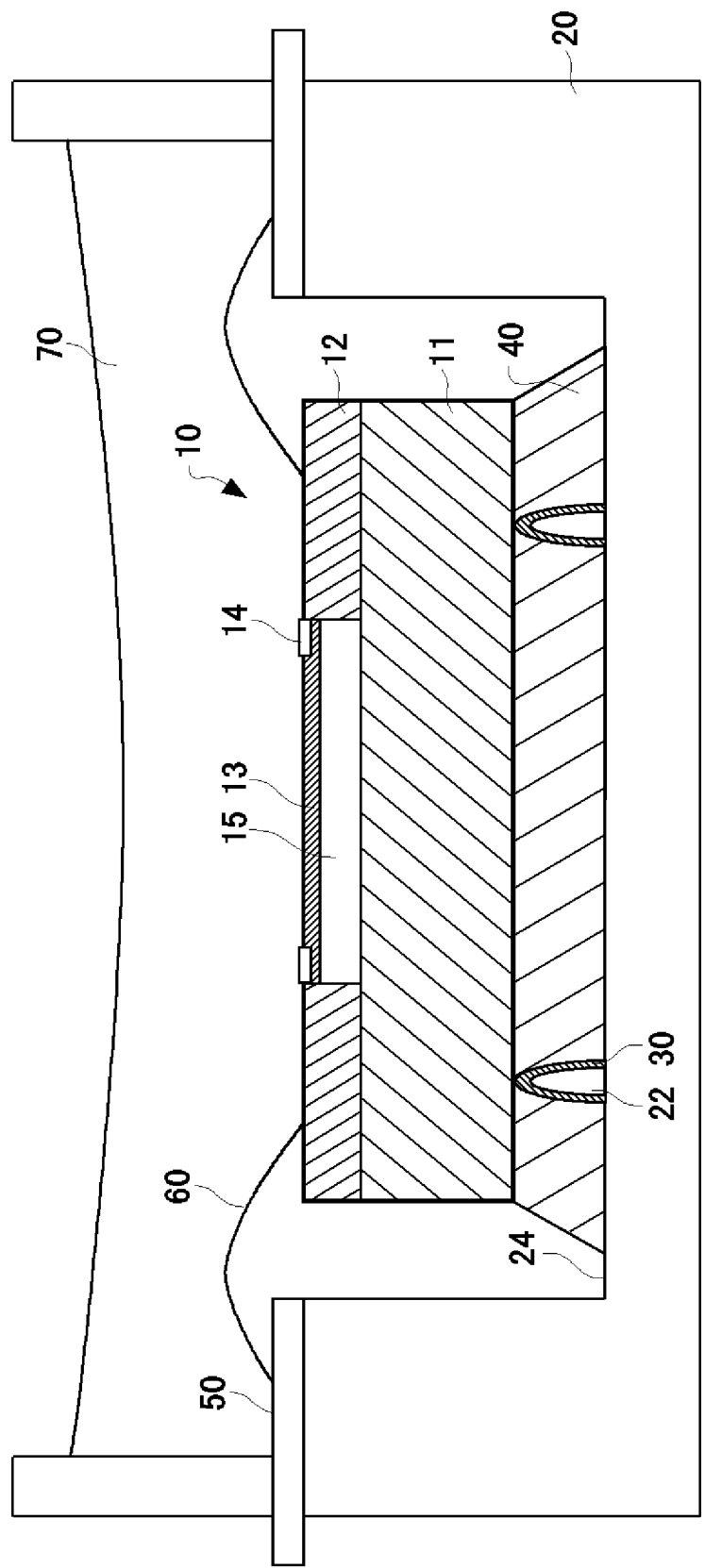
FIG. 3 shows an exemplary cross sectional view of a sensor device 100 according to Embodiment 2.

FIG. 3 shows an exemplary cross sectional view of a sensor device 100 according to Embodiment 2. The sensor device 100 in the present example is different from the sensor device 100 according to Embodiment 1 in that the sensor device 100 has protrusion portions 22.

The protrusion portions 22 are provided on the mounting surface 24 of the casing portion 20. The protrusion portions 22 are provided extending from the mounting surface 24 of the casing portion 20 in a predetermined direction. The elastic portions 30 are provided between the protrusion portions 22 and the sensor portion 10. The protrusion portions 22 may be provided being formed of the same material as the casing portion 20. In this case, the protrusion portions 22 may be molded integrally with the casing portion 20. The protrusion portions 22 are provided between the sensor portion 10 and the casing portion 20, and secure the thickness of the adhesive 40 greater than or equal to a predetermined thickness.

The elastic portion 30 is formed on the upper surface of the protrusion portion 22. The elastic portion 30 may be formed on the side surface of the protrusion portion 22. The elastic portion 30 in the present example covers the surroundings of the protrusion portion 22. The elastic portion 30 relaxes stress applied on the sensor portion 10 between the sensor portion 10 and the protrusion portion 22. As such, at least one layer of the elastic portions 30 is formed between the sensor portion 10 and the protrusion portions 22. The elastic portions 30 absorbs the heat stress from the casing portion 20 to the sensor portion 10.

Figure 4:
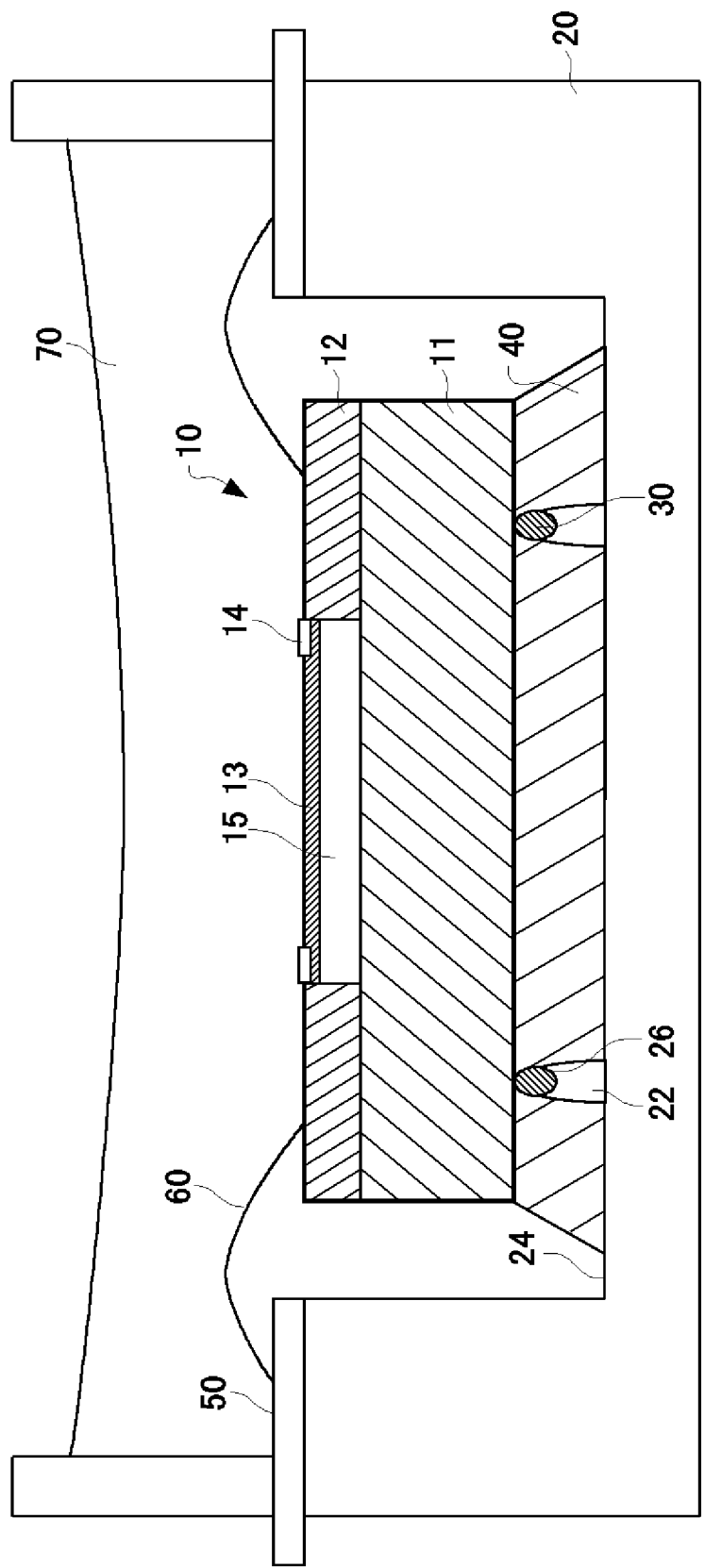
FIG. 4 shows an exemplary cross sectional view of a sensor device 100 according to Embodiment 3.

FIG. 4 shows an exemplary cross sectional view of a sensor device 100 according to Embodiment 3. The sensor device 100 in the present example is different from the sensor device 100 according to Embodiment 2 in that the sensor device 100 has concave parts 26 on the upper portions of the protrusion portions 22.

The protrusion portion 22 has a concave part 26 on the upper surface. The elastic portion 30 is provided at least within the concave part 26. The elastic portions 30 are provided between the sensor portion 10 and the concave part 26. The elastic portion 30 may be provided only in the concave part 26 of the protrusion portion 22, or may be provided, in addition to in the concave part 26, on the side surface of the protrusion portion 22. However, the elastic portions 30 are provided between the sensor portion 10 and the protrusion portion 22, and the protrusion portions 22 are not in direct contact with the sensor portion 10. The protrusion portions 22 are provided at positions where the elastic portions 30 should be arranged. The protrusion portions 22 may function as marks to specify the positions for applying the elastic portions 30. The tip of the protrusion portion 22 may have a concave, convex, or flat shape.

The concave part 26 facilitates arrangement of the elastic portion 30 on the upper portion of the protrusion portion 22. The concave part 26 is only required to be able to hold the elastic portions 30, and its shape is not limited. Preferably, the concave part 26 has a smooth curve so as to hold the elastic portion 30 uniformly. For example, the concave part 26, like the casing portion 20, is provided being formed by molding resin.

The sensor device 100 in the present example, by providing the concave part 26, the elastic portion 30 can be arranged stable on the upper surface of the protrusion portion 22. Thereby, liability of the sensor device 100 improves. It becomes easier for the sensor device 100 to prevent or reduce the variation in the output.

Figure 5:
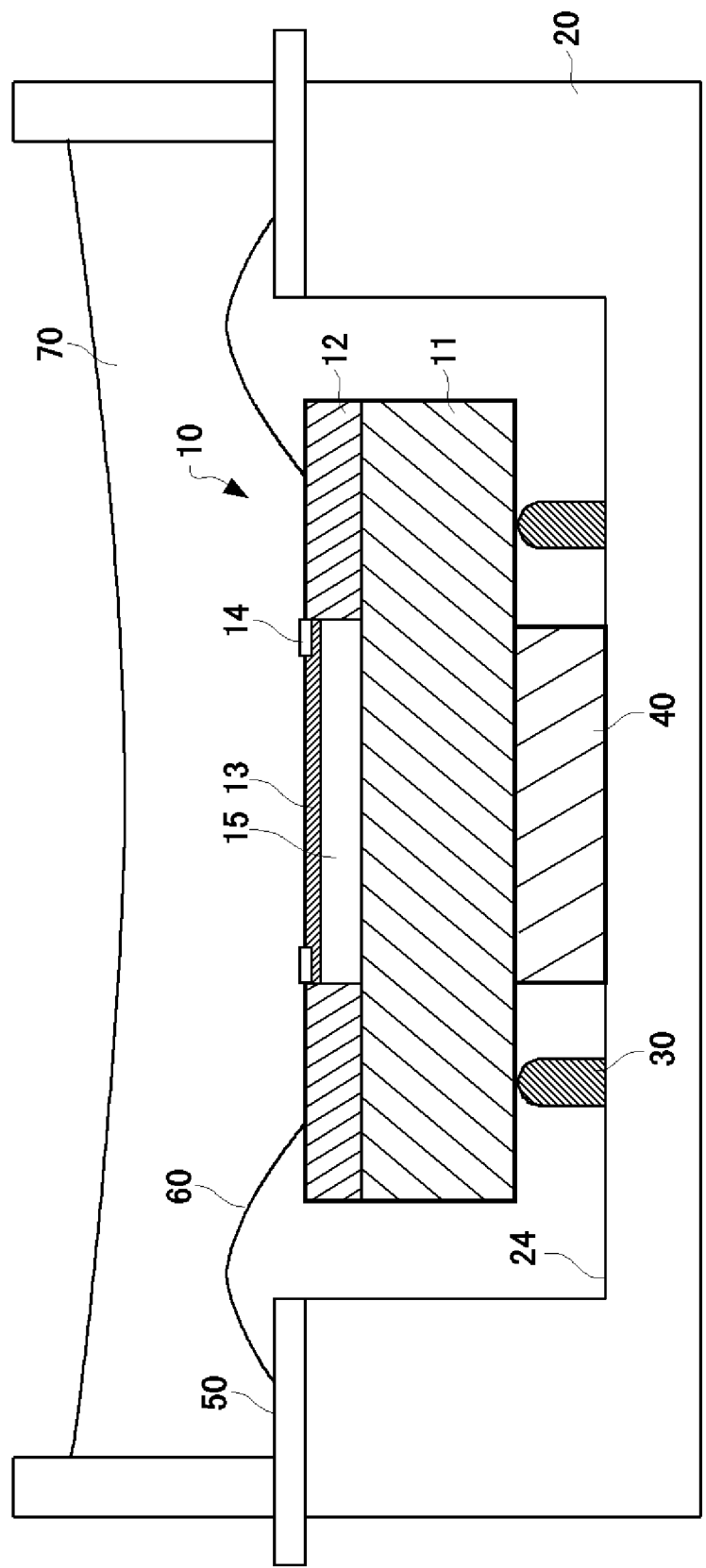
FIG. 5 shows an exemplary cross sectional view of a sensor device 100 according to Embodiment 4.

FIG. 5 shows an exemplary cross sectional view of a sensor device 100 according to Embodiment 4. The sensor device 100 in the present example is different from the sensor device 100 according to Embodiment 1 in that the sensor device 100 has the adhesive 40 inside the sensor portion 10 in the top view.

The adhesive 40 is provided under the sensor portion 10. That is, the adhesive 40 is provided inside of the sensor portion 10 in the top view. The adhesive 40 is not provided outside of the sensor portion 10 in the top view. The adhesive 40 in the present example is provided corresponding to a region where the diaphragm 13 is provided. The adhesive 40 may be provided only inside of the diaphragm 13 in the top view. The adhesive 40 is provided apart from the elastic portions 30. The adhesive 40 is provided closer to the center of the sensor portion 10 than the elastic portion 30 in the top view. By making a region where the adhesive 40 is provided smaller, the influence of the stress from the casing portion 20 to the sensor portion 10 is reduced.

Figure 6:
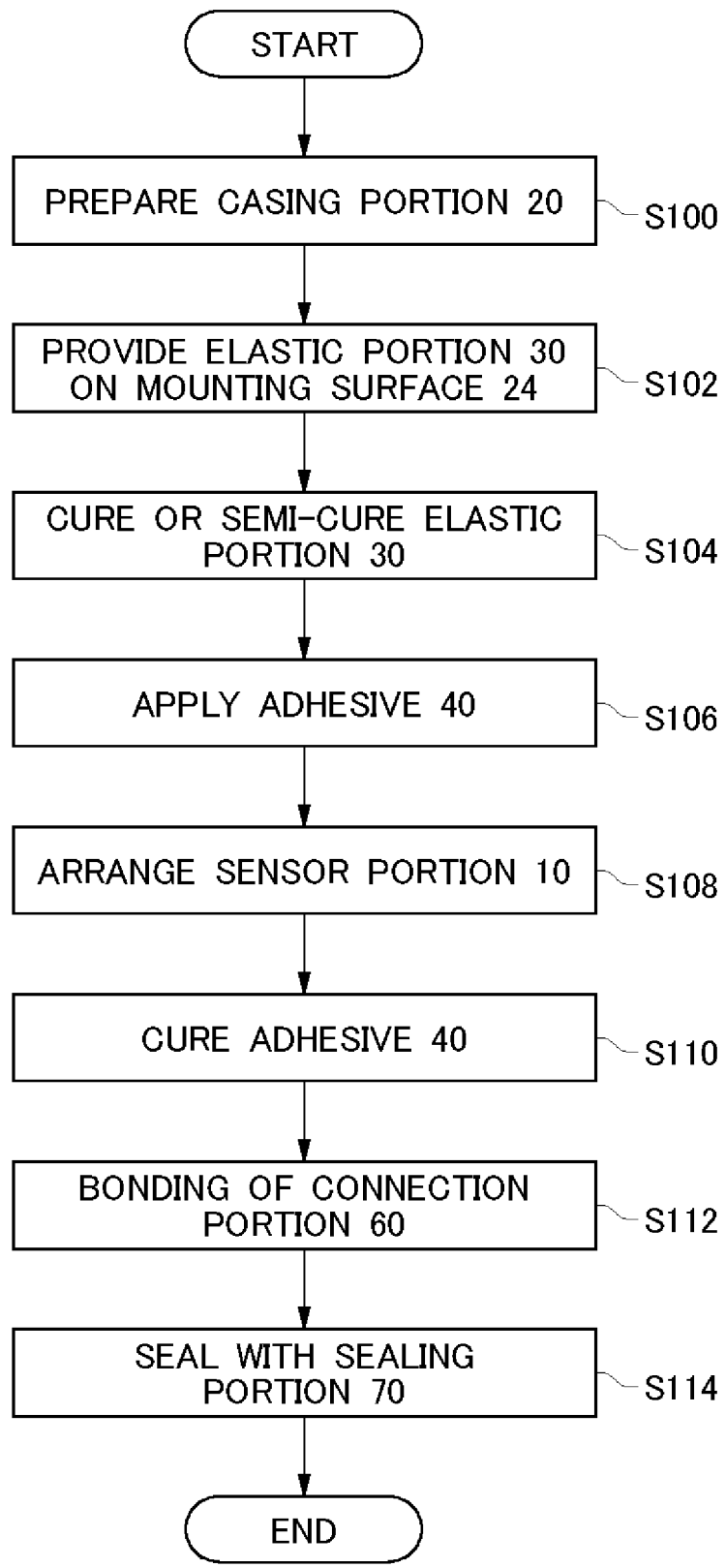
FIG. 6 shows an exemplary flowchart for manufacturing the sensor device 100.

FIG. 6 shows an exemplary flowchart for manufacturing the sensor device 100. The manufacturing method in the present example is an example, and the sensor device 100 may be manufactured by other manufacturing method flowchart.

Prepare the casing portion 20 (S100). The casing portion 20 may be provided by being molded of resin. Provide the elastic portions 30 on the mounting surface 24 of the casing portion 20 (S102). Cure or semi-cure the elastic portion 30 by heating (S104). The elastic portion 30 is held in a predetermined shape by the curing or the semi-curing. The elastic portion 30 is cured so as not to get collapsed even when adhesive 40 is applied. By curing or semi-curing the elastic portions 30, even when the adhesive 40 is applied with the same material as the elastic portions 30, an interface is formed between the elastic portions 30 and the adhesive 40.

Then, apply the adhesive 40 on the mounting surface 24 of the casing portion 20 (S106). Arrange the sensor portion 10 on the adhesive 40 (S108). Note that, since the sensor portion 10 is pressed against and bonded to the casing portion 20, there may be no adhesive 40 between the tops of the elastic portions 30 and the sensor portion 10. That is, the elastic portions 30 may be in direct contact with the sensor portion 10, or in contact via the adhesive 40. Cure the adhesive 40 (S110). As such, the present example has the two thermal curing steps: Step S104 and Step S110. Note that, in the manufacturing process of the sensor device 100, three or more thermal curings may be executed.

By wire bonding of the connection portion 60, the sensor portion 10 and the lead terminal 50 are electrically connected (S112). Finally, seal the sensor portion 10 with the sealing portion 70 (S114).

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. A sensor device comprising:
a sensor portion;
a casing portion housing the sensor portion;

an elastic portion that is provided in contact with the casing portion between the sensor portion and the casing portion and has a material having smaller elastic modulus than elastic modulus of the casing portion; and an adhesive that is provided between the sensor portion and the casing portion.

2. The sensor device according to claim 1, wherein the adhesive has an interface between the elastic portion and the adhesive.

3. The sensor device according to claim 2, wherein the elastic portion has a same material as the adhesive.

4. The sensor device according to claim 1, wherein the elastic portion has smaller elastic modulus than the adhesive.

5. The sensor device according to claim 1, wherein the elastic portion has higher viscosity than the adhesive.

6. The sensor device according to claim 1, wherein the elastic portion is provided in contact with the sensor portion.

7. The sensor device according to claim 1, wherein the elastic portion is fixed on the casing portion.

8. The sensor device according to claim 1, wherein the casing portion has a protrusion portion on a mounting surface on which the sensor portion is mounted, and the elastic portion is provided between the protrusion portion and the sensor portion.

9. The sensor device according to claim 8, wherein the protrusion portion has a concave part on an upper surface thereof, and the elastic portion is provided between the sensor portion and the concave part.

10. The sensor device according to claim 1, wherein the adhesive is provided under the sensor portion and apart from the elastic portion.

* * * * *